(12) United States Patent
Buller et al.

(10) Patent No.: US 7,514,682 B2
(45) Date of Patent: Apr. 7, 2009

(54) ELECTRON ANTI-FOGGING BAFFLE USED AS A DETECTOR

(75) Inventors: Benyamin Buller, Cupertino, CA (US); William J. Devore, Hayward, CA (US); Juergen Frosien, Reimerling (DE); Richard L. Lozes, Pleasanton, CA (US); Henry Pearce-Percy, Los Gatos, CA (US); Dieter Winkler, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 184 days.

(21) Appl. No.: 11/537,062

(22) Filed: Sep. 29, 2006

(65) Prior Publication Data
US 2007/0145269 A1 Jun. 28, 2007

Related U.S. Application Data

(60) Provisional application No. 60/722,343, filed on Sep. 30, 2005.

(51) Int. Cl.
*H01J 37/09* (2006.01)
*G01N 23/00* (2006.01)
*G21K 7/00* (2006.01)

(52) U.S. Cl. .......... 250/310; 250/397; 250/396 R
(58) Field of Classification Search .......... 250/306, 250/307, 310, 396 R, 396 ML, 397, 398, 250/492.1, 492.2, 492.3, 505.1, 515.1
See application file for complete search history.

(56) References Cited

U.S. PATENT DOCUMENTS

| | | | | |
|---|---|---|---|---|
| 3,582,649 | A | * | 6/1971 | Taylor .......... 250/305 |
| 5,838,006 | A | * | 11/1998 | Veneklasen et al. .......... 250/310 |
| 6,326,635 | B1 | * | 12/2001 | Innes et al. .......... 250/505.1 |
| 7,154,089 | B2 | * | 12/2006 | Katane et al. .......... 250/310 |
| 2005/0127294 | A1 | * | 6/2005 | Katane et al. .......... 250/311 |
| 2007/0145269 | A1 | * | 6/2007 | Buller et al. .......... 250/310 |

* cited by examiner

*Primary Examiner*—Bernard E Souw
(74) *Attorney, Agent, or Firm*—Patterson & Sheridan LLP

(57) ABSTRACT

Methods and apparatus to facilitate the measurement of the amount of scattered electrons collected by an anti-fogging baffle arrangement are provided. For some embodiments, by affixing a lead to an electrically isolated (floating) portion of the baffle arrangement, the amount of scattered electrons collected thereby may be read out, for example, as a current signal. Thus, for such embodiments, the baffle arrangement may double as a detector, allowing an image of surface (e.g., a mask or substrate surface) to be generated.

20 Claims, 6 Drawing Sheets

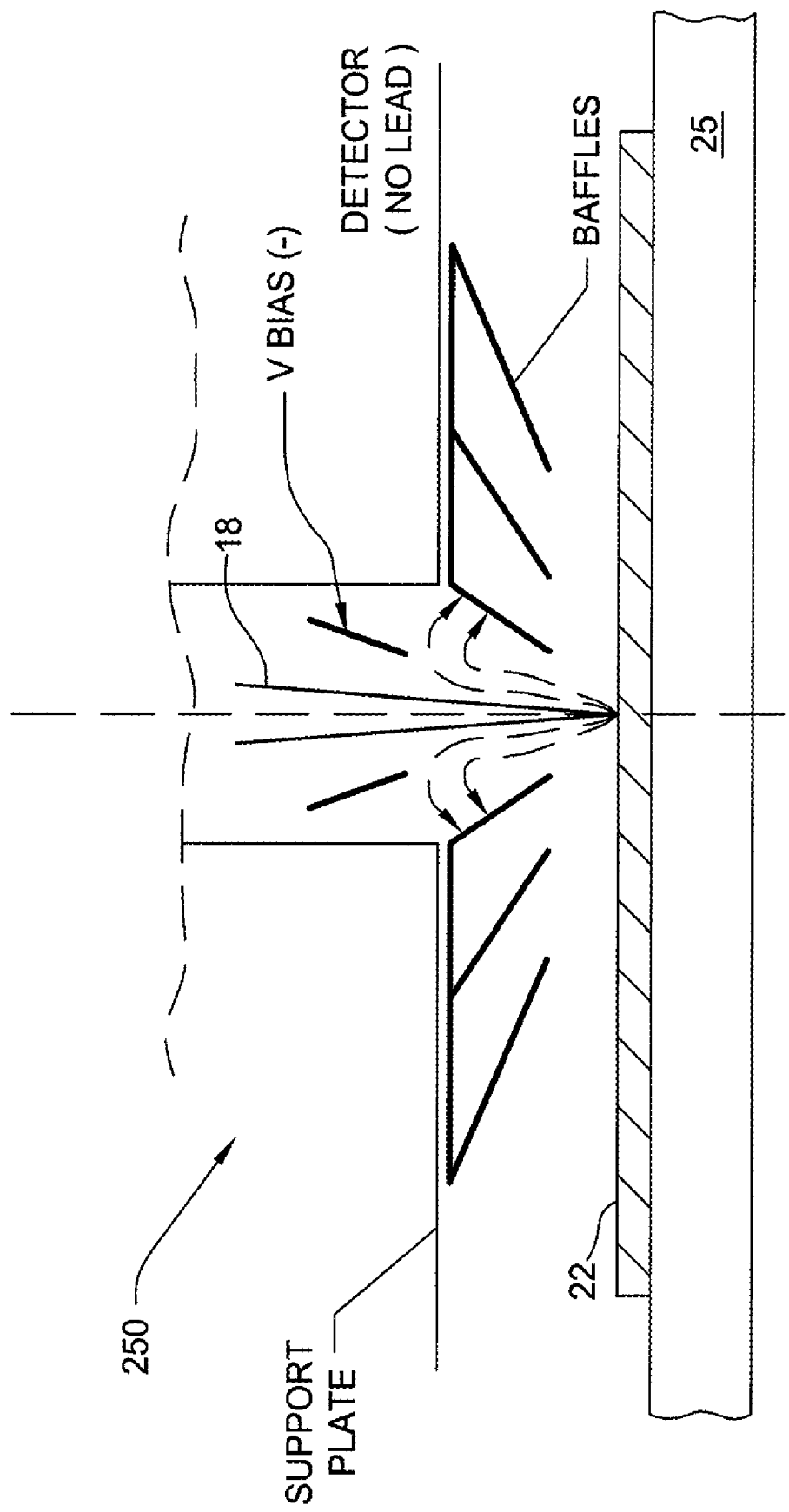

ELECTRON ANTI-FOGGING BAFFLE USED AS A DETECTOR

CROSS-REFERENCE TO RELATED APPLICATIONS

This application claims benefit of U.S. provisional patent application Ser. No. 60/722,343, filed Sep. 30, 2005, which is herein incorporated by reference.

BACKGROUND OF THE INVENTION

1. Field of the Invention

This invention relates to electron beam lithography and particularly to utilizing an electron anti-fogging baffle as a detector.

2. Description of the Related Art

Electron beam lithography typically uses electrons accelerated in vacuum to expose a resist by penetrating the resist layer. When an electron beam of sufficient energy (e.g., 50 keV) impinges on a substrate, such as in a lithographic exposure of a resist-coated mask, electrons are emitted from the mask surface. Lower level energy electrons are typically referred to as "secondary electrons" while higher energy level electrons are referred to as "backscattered electrons." Most of the secondary electrons have an energy level below 50 eV, whereas most of the backscattered electrons have an energy level above at least 20 keV.

Conical baffles placed near the substrate surface are often used to control the effects of these scattered electrons. One use of such baffles is to reduce charging-induced beam drift, as taught in U.S. Pat. No. 5,838,006, incorporated herein by reference in its entirety. The conical baffles are arranged such that scattered electrons impinge on baffle surfaces that are not directly seen by the primary beam. Because these baffle surfaces are not directly seen by the primary beam, charge accumulation and hydrocarbon film formation thereon do not significantly affect the primary beam.

Scattered electrons from the substrate surface can also strike the bottom of the objective lens and excite additional scattered electrons ("objective scatter") that can expose the resist in a diffuse way. This additional exposure, generally referred to as fogging, can disturb the fidelity of the main exposure. This fogging can be controlled to some degree by an arrangement of multiple (concentric) conical baffles, as taught in U.S. Pat. No. 6,326,635, incorporated herein by reference in its entirety. The effect of such in arrangement is to provide controlled paths for the scattered electrons designed to reduce the probability of scattered electrons striking the objective lens (thereby causing objective scatter) and/or reduce the probability of objective scatter returning to the mask. To help accomplish this, the baffles may be arranged in a manner that presents a minimal cross-sectional area to the substrate-scattered electrons. The minimal cross-sectional area may help the baffles collect substrate-scattered electrons by guiding them into vanes where they are absorbed by baffle surfaces.

The amount of electrons scattered from a mask surface, and collected by the baffle, will depend on the particular features of the surface. As an example, different geometrical features and textures may result in varying amounts of scattered electrons. As a result, a useful image of the surface could be formed if the amount of collected electrons could be plotted as the beam is scanned over some or all of the mask surface. However, there is currently no available mechanism for easily capturing this information. As a result, to generate such an image in a conventional beam writing system, specialized sensors are required.

However, such specialized sensors add cost and complexity, which may not be justified for a system whose primary purpose is writing. Accordingly, what is needed is an improved anti-fogging baffle arrangement that allows the amount of scattered electrons collected therein to be captured.

SUMMARY OF THE INVENTION

Embodiments of the present invention allow for improved baffle arrangements.

One embodiment provides an anti-fogging baffle arrangement. The arrangement generally includes a main baffle portion electrically isolated and positioned to collect electrons scattered from a workpiece surface and a lead for providing a signal indicating an amount of electrons collected by the main baffle portion.

Another embodiment provides an anti-fogging baffle arrangement for use in a beam column. The arrangement generally includes a main baffle portion having a center opening allowing a main beam to pass and positioned to collect electrons scattered from a workpiece surface and an inner baffle portion also having a center opening allowing the main beam to pass and positioned above the main baffle portion, wherein the inner baffle portion is negatively biased to repel electrons to prevent said repelled electrons from traveling up the beam column.

Another embodiment provides an electron beam system. The electron beam system includes an electron gun for generating an electron beam, an electron beam column, a deflector for deflecting the electron beam, an anti-fogging baffle arrangement, and at least one bias voltage source connected to the anti-fogging baffle arrangement. The anti-fogging baffle arrangement includes a main baffle portion having a center opening allowing the electron beam to pass and positioned to collect scattered electrons from a workpiece surface and an inner baffle portion also having a center opening allowing the electron beam to pass and positioned above the main baffle portion.

Another embodiment provides an anti-fogging baffle arrangement. The anti-fogging baffle arrangement includes a main baffle portion electrically isolated and positioned to collect electrons scattered from a workpiece surface and a lead for providing a signal indicating an amount of electrons collected by the main baffle portion.

Another embodiment provides a method for measuring an amount of electrons scattered from a workpiece surface. An electron beam is generated in a beam tube. The electron beam is deflected onto a surface of a workpiece causing the production of scattered electrons. A surface of the beam tube is shielded from scattered electrons with an anti-fogging baffle arrangement. The anti-fogging baffle arrangement is used to collect the scattered electrons. A current signal is generated by electrically isolating a portion of the scattered electrons collected using the anti-fogging baffle arrangement. An image of at least some portion of the surface of the workpiece is generated using the current signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2C is a side view of another exemplary baffle arrangement in accordance with one embodiment of the present invention;

Figure 1:
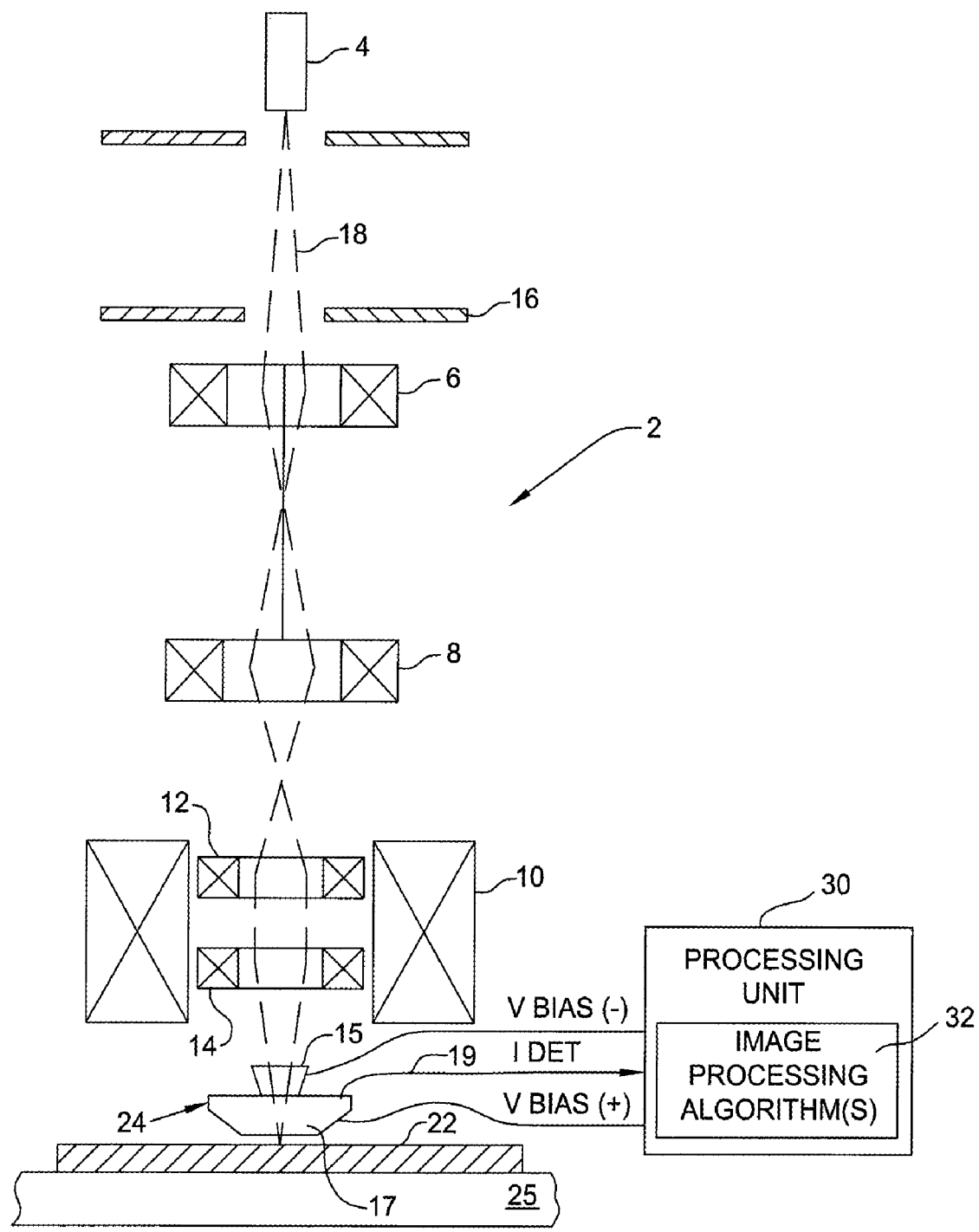
FIG. 1 is a schematic view of an electron beam column utilizing a baffle arrangement in accordance with one or more embodiments of the present invention.

To facilitate understanding, identical reference numerals have been used wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention facilitate the measurement of the amount of scattered electrons collected by an anti-fogging baffle arrangement. For some embodiments, by affixing a lead to an electrically isolated (floating) portion of the baffle arrangement, the amount of scattered electrons collected thereby may be read out, for example, as a current signal. Thus, for such embodiments, the baffle arrangement may double as a detector, allowing an image of a surface (e.g., a mask or substrate surface) to be generated.

For some embodiments, an inner baffle may be negatively biased which may provide a number of advantages. One advantage is that the negative bias may serve to enhance the detector signal by repelling upwardly moving scattered electrons back towards the floating portion of the baffle having the detector lead and, thereby increasing the amount of electrons collected. Another advantage is that repelling upwardly moving scattered electrons may keep such scattered electrons from traveling up the electron beam column and causing damage, for example, due to charge collection and/or carbon accumulation. As this advantage is independent of electron collection and detection, for some embodiments, a baffle arrangement with a negatively biased inner baffle may be provided without a detector lead.

An Exemplary Beam Column

Electron beam systems generally have an electron beam column configured to shape electron beams and to move shaped electron beams to desired locations on a target. FIG. 1 illustrates in a side view an exemplary electron beam column 2 including an anti-fogging baffle arrangement 24 that may double as a detector, in accordance with embodiments of the present invention. Other than the baffle arrangement 24, the electron beam column 2 may include a variety of other conventional components and those skilled in the art will appreciate that the baffle arrangement 24 may be used to advantage with a variety of different beam columns having different arrangements of a variety of different components.

Electron beam columns, such as electron beam column 2, are typically used in applications such as electron beam lithography, for example, used in forming images on a resist on a wafer or reticle. In operation, an electron beam 18 is generated by electron gun 4. Traveling through electron beam column 2, an electron beam 18 first passes through aperture 16 and a first condenser lens 6. Electron beam 18 may then cross over and passes through a second condenser lens 8. Electron beam 18 may cross over again before passing through objective lens assembly 10. While passing through objective lens assembly 10, the electron beam 18 passes upper deflection coil 12 and lower deflection coil 14 (a wide variety of different deflection arrangements are well known). Various other components, such as support structures, vacuum housing, and electrical, cooling, and vacuum connections are not illustrated for simplicity.

As illustrated, the baffle assembly 24 may be located at a lower portion of the electron beam column 2, just above a workpiece 22 (e.g., a mask for exposing a resist-bearing substrate). The electron beam 18 may travel through the baffle assembly 24 and strike the surface of the workpiece 22 causing scattered electrons, as previously described. As will be described in greater detail below, a main baffle portion 17 may be designed to collect scattered electrons and reduce fogging by preventing the scattered electrons from striking the objective lens assembly 10. The main baffle portion 17 may be constructed with attributes (e.g., vanes, surfaces shapes, and dimensions) similar to those of the baffle arrangements described in detail in the previously referenced U.S. Pat. No. 6,326,635.

For some embodiments, the amount of electrons collected by the main baffle portion 17 (or at least an electrically isolated portion thereof) may be provided on a conductor (electrically coupled to the main baffle portion 17) as a detector signal, in the form of a current signal $I_{DET}$ 19. In other words, the accumulation of collected electrons may cause a buildup of charge, resulting in a flow of current via a conductor attached to the main baffle portion 17. As will be described in greater detail below, for some embodiments, a bias voltage may be applied to an inner baffle portion 15 and/or to the main baffle portion 17 to aid in scattered electron collection and/or prevent electrons from traveling through the baffle arrangement 24 and up the electron beam column 2.

A processing unit 30 may receive the detector signal and generate an image of at least some portion of the workpiece surface. The processing unit 30 may include any suitable components, including positive and negative voltage bias sources, current to voltage converters, and analog to digital (A/D) converters necessary to interpret and capture the detector signal. For some embodiments, the positive and negative voltage bias sources may be separate from the processing unit 30. For some embodiments, the processing unit 30 may also control the motion of a stage 25 on which the workpiece 22 is held, and may also receive positional information from a stage positioning system (e.g., a laser interferometer) to determine a precise position of the state relative to the beam. As a result, the processing unit 30 may be able to generate an image of a portion of the workpiece surface scanned while monitoring the detector signal.

Image processing algorithm 32 may include algorithms for performing any number of various diagnostic and/or inspection functions based on a generated image. As an example, one image processing algorithm may be designed to analyze a generated image to detect the position(s) of marks formed on the surface of the workpiece 22 to verify proper location of the marks. Another image processing algorithm may be designed to inspect fiduciary marks to ensure the beam is striking the workpiece 22 in a desired location. Yet another image processing algorithm may determine if different portions of a workpiece surface have a same focus in the image to ensure the workpiece 22 is positioned properly (e.g., level) on the stage 25.

Exemplary Baffle Arrangements

Figure 2A:
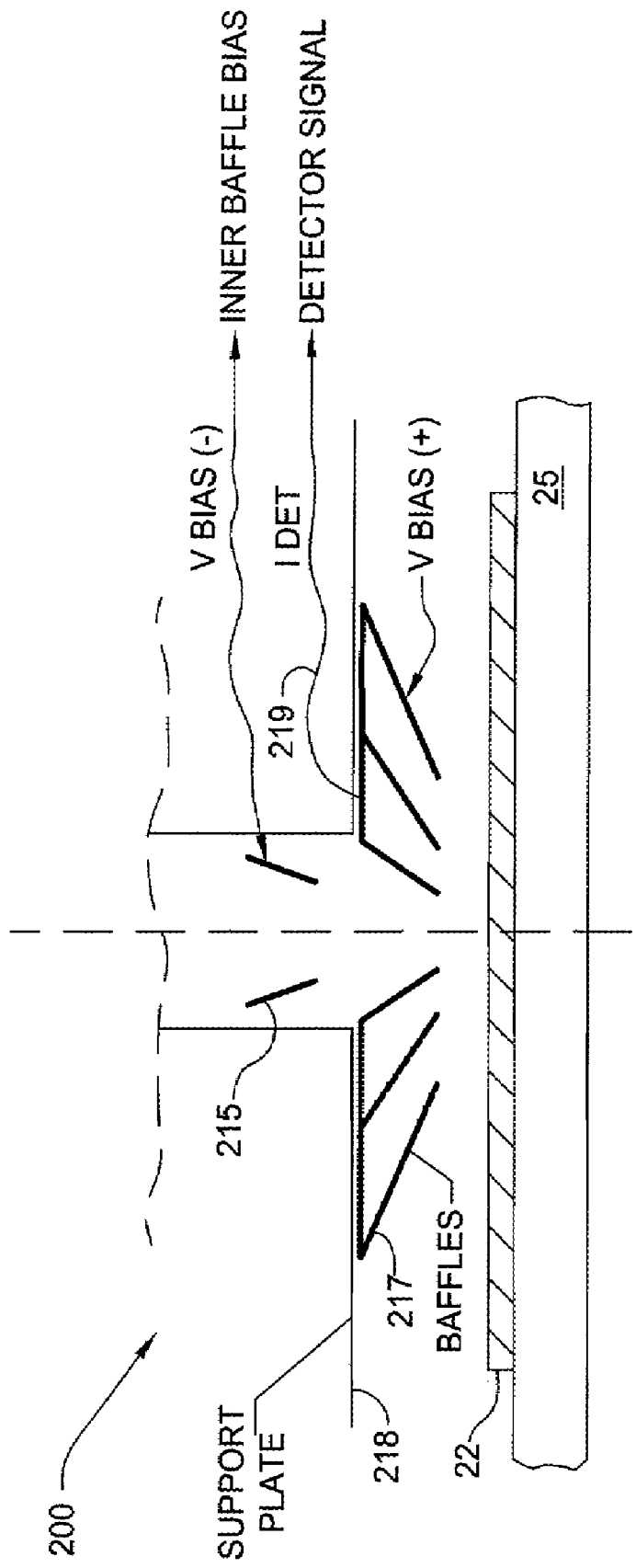
FIG. 2A is a side view of an exemplary baffle arrangement in accordance with one embodiment of the present invention.

FIG. 2A is a side view of an exemplary baffle assembly 200 (e.g., one example of the baffle assembly 24 shown in FIG. 1) in accordance with one embodiment of the present invention. In this arrangement, the main baffle portion 217 may be electrically coupled to a support plate 218. In this embodiment, the amount of electrons collected by the main baffle portion 217 may be provided on a conductor as a detector signal, in the form of a current signal $I_{DET}$ 219. By collecting the current signal $I_{DET}$ 19 from the majority of the baffle assembly (in this example, all but the inner baffle portion 215), the signal amplitude may be optimized.

In some cases, the inner baffle portion 215 may be negatively biased (e.g., from −5 to −50V), which may also help optimize the signal strength by repelling scattered electrons traveling up from the workpiece surface towards the main baffle portion 217. Further, for some embodiments, the main baffle portion 217 may be positively biased (e.g., from 5-50V), which may also help attract scattered electrons. Such low bias voltages should have a negligible effect on the primary beam (e.g., at 50 keV). However, small spurious deflections of the primary beam may occur if the ground plane below is asymmetrical, for example, when a clamp covers part of the edge of a mask. In such cases, the bias voltage may be set to zero. For some embodiments, generating an image with the detector may occur relatively infrequently, such that spurious deflections will not generally be a problem.

Figure 2B:
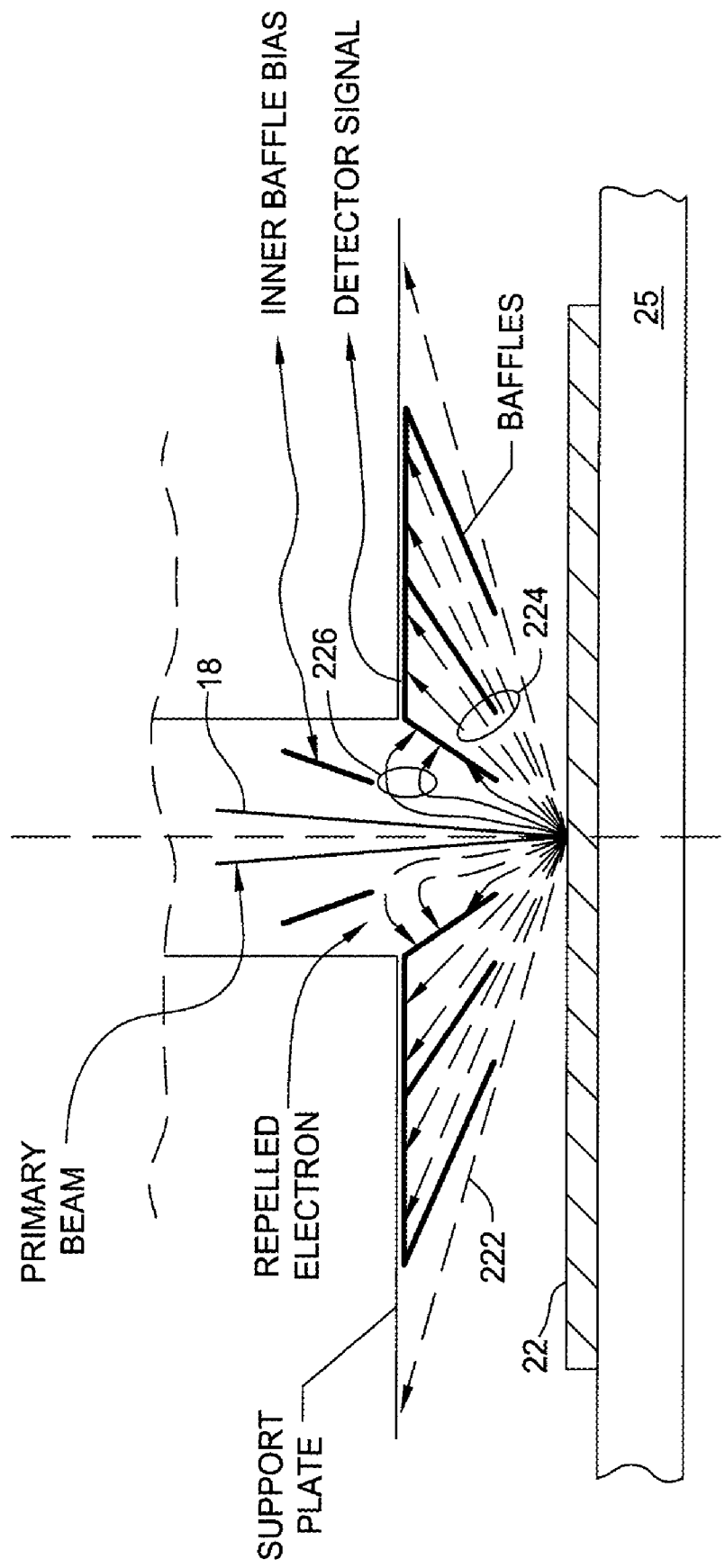
FIG. 2B illustrates the collection of scattered electrons by the baffle arrangement of FIG. 2A.

FIG. 2B illustrates the travel of scattered electrons from the workpiece 22 to the baffle assembly 200, according to one embodiment. As illustrated, scattered electrons are typically generated in all directions. At a wide angle, scattered electrons 222 will strike the support plate 218, while scattered electrons 224 at a less wide angle will travel in vanes and strike the main baffle portion 217. Assuming, for this example, a negative bias applied to the inner baffle portion 215, scattered electrons 226 traveling up from the workpiece surface will be repelled back toward the main baffle portion 217.

As previously stated, repelling electrons in this manner may also have advantage even if detection is not taking place. Therefore, as shown in FIG. 2C, for some embodiments, a baffle arrangement with a negatively biased inner baffle portion 215 may be provided for a baffle assembly 250 that does not have a detector lead coupled to the main baffle portion 217.

Although the assemblies formed by the main baffle portion 217 electrically coupled to the support plate 218, as shown in FIGS. 2A-2C may result in increase signal collection, the relatively large capacitance formed by the main baffle portion 217 may have a negative impact on signal rise time. Therefore, for some embodiments, only an inner baffle portion may be electrically isolated, in an effort to reduce capacitance.

Figure 3A:
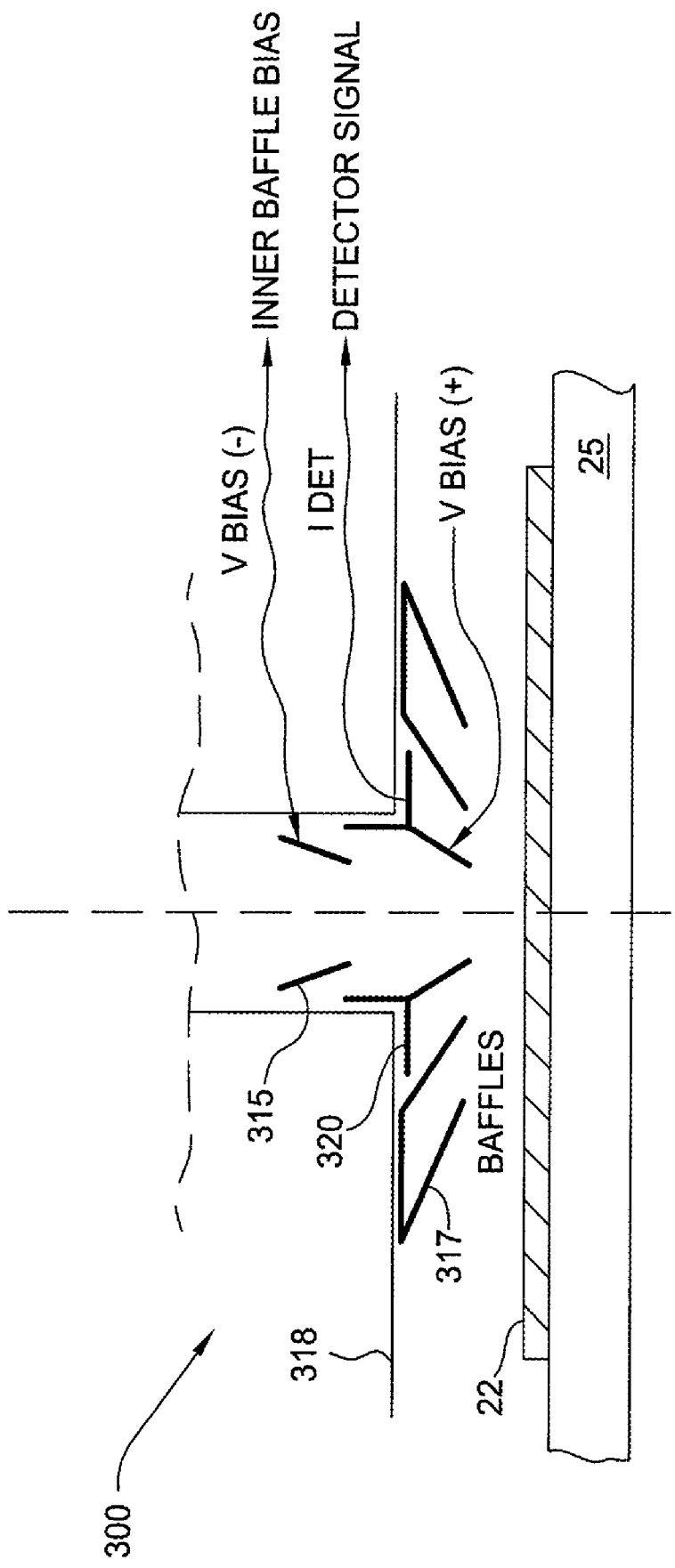
FIG. 3A is a side view of yet another exemplary baffle arrangement in accordance with one embodiment of the present invention.
Figure 3B:
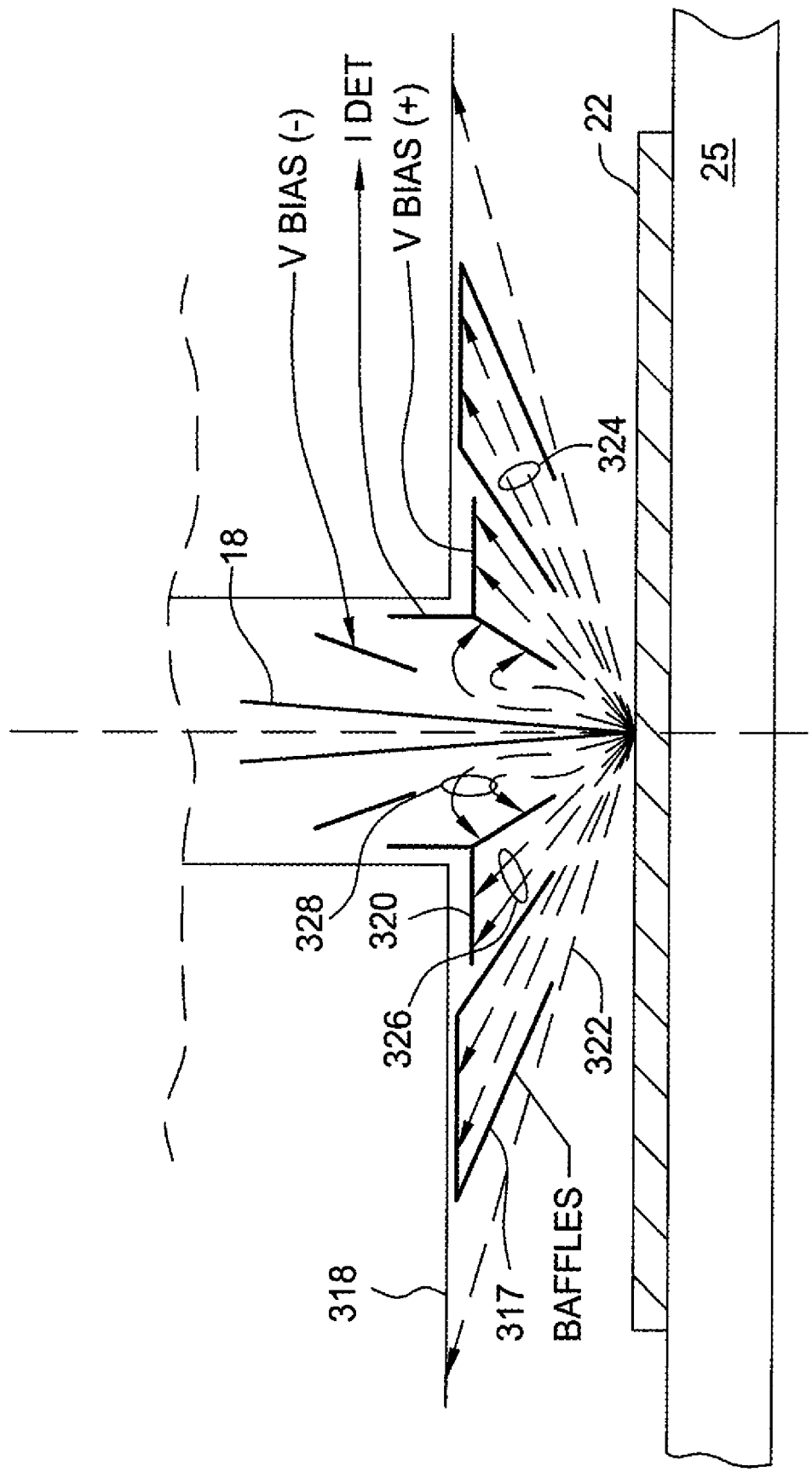
FIG. 3B illustrates the collection of scattered electrons by the baffle arrangement of FIG. 3A.

FIG. 3A illustrates such an arrangement of a baffle assembly 300, where only a lower inner baffle portion 320 is electrically isolated. As illustrated in FIG. 3B, scattered electrons 326 and 328 (assuming negative bias to an inner baffle portion 315) will strike the lower inner baffle portion 320 and thus contribute to signal strength. On the other hand, scattered electrons 322 and 324 and wider angles will strike the support plate 318 and the main baffle portion 317, respectively, and will not contribute to signal strength. While this may result in slightly reduced signal collection relative to arrangement of FIGS. 2A-2C, signal strength may be increased by including a cylinder and parts of the support plate.

CONCLUSION

By electrically coupling a signal lead to a portion of a baffle assembly, a signal corresponding to the amount of scattered electrons may be provided. As a result, an electron anti-fogging baffle assembly may also double as a detector, which may allow for diagnostic imaging, without a costly separate detector.

While the foregoing is directed to embodiments of the present invention, other and further embodiments of the invention may be devised without departing from the basic scope thereof, and the scope thereof is determined by the claims that follow.

The invention claimed is:

1. An electron beam system, comprising:
   an electron gun for generating an electron beam;
   an electron beam column;
   a deflector for deflecting the electron beam;
   an anti-fogging baffle arrangement having a main baffle portion having a center opening allowing the electron beam to pass and positioned to collect scattered electrons from a workpiece surface and an inner baffle portion also having a center opening allowing the electron beam to pass and positioned above the main baffle portion;
   at least one bias voltage source connected to the inner baffle portion; and
   an electrical lead connected to the main baffle portion, wherein the main baffle portion and the inner baffle portion are electrically isolated from one another.

2. The electron beam system of claim 1, wherein the main baffle portion is electrically coupled to a support plate.

3. An anti-fogging baffle arrangement, comprising:
   a main baffle portion electrically isolated and positioned to collect electrons scattered from a workpiece surface and an inner baffle portion having a center opening allowing an electron beam to pass and positioned above the main baffle portion; and
   a lead for providing a signal indicating an amount of electrons collected by the main baffle portion.

4. The anti-fogging baffle arrangement of claim 3, further comprising an inner baffle portion having a center opening and positioned above the main baffle portion.

5. The anti-fogging baffle arrangement of claim 3, further comprising a negative bias source connected to the inner baffle portion, wherein the negative bias source is configured to negatively bias the inner baffle portion to repel scattered electrons.

6. The anti-fogging baffle arrangement of claim 3, further comprising a positive bias source connected to the main baffle portion, wherein the positive bias source is configured to positively bias the main baffle portion to attract scattered electrons.

7. The anti-fogging baffle arrangement of claim 5, further comprising a positive bias source connected to the main baffle portion.

8. A method for measuring an amount of electrons scattered from a workpiece surface, comprising:
   generating an electron beam in a beam tube;
   deflecting the electron beam onto the workpiece surface causing the production of scattered electrons;

shielding a surface of the beam tube from scattered electrons with an anti-fogging baffle arrangement;
collecting scattered electrons using the anti-fogging baffle arrangement;
generating a current signal by electrically isolating a portion of the scattered electrons collected using the anti-fogging baffle arrangement; and
generating an image of at least some portion of the workpiece surface using the current signal.

9. The method of claim 8, further comprising applying a bias voltage to at least a portion of the anti-fogging baffle arrangement.

10. The method of claim 9, wherein the bias voltage is applied in a manner designed to enhance scattered electron collection and to prevent electrons from traveling through the anti-fogging baffle arrangement and up the beam tube.

11. The method of claim 8, further comprising analyzing the image to detect a position of marks formed on the workpiece surface.

12. The method of claim 8, further comprising analyzing the image to inspect fiduciary marks to ensure that the electron beam is striking the workpiece surface in a desired location.

13. The method of claim 8, further comprising analyzing the image to determine if different portions of the workpiece surface have a same focus in the image.

14. The method of claim 9, wherein applying a bias voltage comprises applying a negative bias between about −5 and about −50 volts.

15. The method of claim 9, wherein applying a bias voltage comprises applying a positive bias between about 5 and about 50 volts.

16. An electron beam system, comprising:
an electron gun for generating an electron beam;
an electron beam column;
a deflector for deflecting the electron beam;
an anti-fogging baffle arrangement having a main baffle portion having a center opening allowing the electron beam to pass and positioned to collect scattered electrons from a workpiece surface and an inner baffle portion also having a center opening allowing the electron beam to pass and positioned above the main baffle portion; and
at least one bias voltage source connected to the anti-fogging baffle arrangement, wherein the at least one bias voltage source provides a negative bias voltage to the anti-fogging baffle arrangement to prevent the scattered electrons from traveling up the electron beam column.

17. The electron beam system of claim 16, wherein the at least one bias voltage source provides a positive bias voltage to the main baffle portion to attract scattered electrons.

18. An electron beam system, comprising:
an electron gun for generating an electron beam
an electron beam column;
a deflector for deflecting the electron beam;
an anti-fogging baffle arrangement having a main baffle portion having a center opening allowing the electron beam to pass and positioned to collect scattered electrons from a workpiece surface and an inner baffle portion also having a center opening allowing the electron beam to pass and positioned above the main baffle portion; and
at least one bias voltage source connected to the anti-fogging baffle arrangement, wherein the at least one bias voltage source provides a positive bias voltage to the main baffle portion to attract scattered electrons.

19. The electron beam system of claim 18, wherein the anti-fogging baffle arrangement includes a lead, the at least one bias voltage source is part of a processing unit electrically connected to the lead, wherein the processing unit is configured to generate an image of at least some portion of the workpiece surface using the current signal.

20. The electron beam system of claim 19, wherein the processing unit is configured to utilize image processing algorithms to analyze a generated image to detect a position of marks formed on the workpiece surface.

* * * * *

UNITED STATES PATENT AND TRADEMARK OFFICE
CERTIFICATE OF CORRECTION

PATENT NO. : 7,514,682 B2
APPLICATION NO. : 11/537062
DATED : April 7, 2009
INVENTOR(S) : Buller et al.

Page 1 of 1

It is certified that error appears in the above-identified patent and that said Letters Patent is hereby corrected as shown below:

Column 6, Claim 4, Lines 46-48, please delete "The anti-fogging baffle arrangement of claim 3, further comprising an inner baffle portion having a center opening and positioned above the main baffle portion.".

Signed and Sealed this

Thirtieth Day of June, 2009

JOHN DOLL
*Acting Director of the United States Patent and Trademark Office*